(12) United States Patent
Kim et al.

(10) Patent No.: US 9,324,623 B1
(45) Date of Patent: Apr. 26, 2016

(54) METHOD OF MANUFACTURING SEMICONDUCTOR DEVICE HAVING ACTIVE FINS

(71) Applicant: SAMSUNG ELECTRONICS CO., LTD., Suwon-si, Gyeonggi-do (KR)

(72) Inventors: Jin-Bum Kim, Seoul (KR); Ha-Kyu Seong, Gyeonggi-do (KR)

(73) Assignee: SAMSUNG ELECTRONICS CO., LTD., Suwon-Si, Gyeonggi-Do (KR)

(*) Notice: Subject to any disclaimer, the term of this patent is extended or adjusted under 35 U.S.C. 154(b) by 0 days.

(21) Appl. No.: 14/554,133

(22) Filed: Nov. 26, 2014

(51) Int. Cl.
*H01L 21/336* (2006.01)
*H01L 21/8238* (2006.01)
*H01L 21/285* (2006.01)
*H01L 21/324* (2006.01)

(52) U.S. Cl.
CPC .. *H01L 21/823814* (2013.01); *H01L 21/28518* (2013.01); *H01L 21/324* (2013.01); *H01L 21/823821* (2013.01)

(58) Field of Classification Search
CPC ............... H01L 21/823431; H01L 21/0214; H01L 21/0217; H01L 21/32139; H01L 21/02532; H01L 21/823418; H01L 21/28518; H01L 21/02164
USPC ....................................................... 438/283
See application file for complete search history.

(56) References Cited

U.S. PATENT DOCUMENTS

| 7,198,995 | B2 | 4/2007 | Chidambarrao et al. |
| 7,335,544 | B2 | 2/2008 | Chen et al. |
| 7,388,259 | B2 | 6/2008 | Doris et al. |
| 7,655,511 | B2 | 2/2010 | Chidambarrao |
| 7,718,500 | B2 | 5/2010 | Chong et al. |
| 7,923,321 | B2 | 4/2011 | Lai et al. |
| 8,278,196 | B2 | 10/2012 | Huang et al. |
| 8,338,259 | B2 | 12/2012 | Wu et al. |
| 2009/0218633 | A1 | 9/2009 | Hoentschel et al. |
| 2011/0068407 | A1 | 3/2011 | Yeh et al. |
| 2011/0201164 | A1* | 8/2011 | Chung ............ H01L 21/823807 438/229 |
| 2013/0078800 | A1* | 3/2013 | Lai ................... H01L 21/28052 438/653 |
| 2014/0203370 | A1* | 7/2014 | Maeda ................. H01L 29/785 257/365 |
| 2014/0299934 | A1* | 10/2014 | Kim .................... H01L 29/7848 257/347 |
| 2015/0041855 | A1* | 2/2015 | Liao ................. H01L 29/41791 257/192 |
| 2015/0137181 | A1* | 5/2015 | Basker ............... H01L 27/0924 257/192 |

FOREIGN PATENT DOCUMENTS

KR 1020100078515 7/2010

* cited by examiner

*Primary Examiner* — Trung Q Dang
(74) *Attorney, Agent, or Firm* — F. Chau & Associates, LLC

(57) ABSTRACT

Provided is a method of manufacturing a semiconductor device. The method of manufacturing the semiconductor includes preparing a substrate on which a first region and a second region are defined, forming a first active fin and a second active fin in the first and second regions, respectively, forming a first gate structure and a second gate structure on the substrate in a direction that crosses the first and second active fins, forming a first recess in the first active fin that is adjacent to one side surface of the first gate structure, forming a first epitaxial layer in the first recess, forming a first silicide layer on the first epitaxial layer, forming a second recess in the second active fin that is adjacent to one side surface of the second gate structure, and forming a second silicide layer in the second recess, wherein the second silicide layer includes nickel (Ni) and platinum (Pt).

20 Claims, 29 Drawing Sheets

METHOD OF MANUFACTURING SEMICONDUCTOR DEVICE HAVING ACTIVE FINS

TECHNICAL FIELD

The present inventive concept relates to a method of manufacturing a semiconductor device.

DISCUSSION OF RELATED ART

Recently, semiconductor devices have been developed that can perform high-speed operation at low voltage, and processes of manufacturing semiconductor devices have been developed that can increase structural integrity of the semiconductor device.

In order to endure a short channel effect better than conventional field effect transistors and to provide higher driving current at low voltage, there has been an increased interest in fin field effect transistors (FinFETs) in which channels are formed in a 3D spatial structure. Recently, a technique that increases carrier mobility of a channel region of the semiconductor device has been used.

SUMMARY

One aspect of the present inventive concept is to provide a method of manufacturing a semiconductor device, which forms a stress layer that provides compressive stress to increase hole mobility in a channel of a PMOS region and simultaneously forms a stress layer that provides tensile stress to increase electron mobility in a channel of an NMOS region.

Additional aspects, subjects, and features of the present inventive concept will be set forth in part in the description which follows and in part will become apparent to those having ordinary skill in the art upon examination of the following or may be learned from practice of the present inventive concept.

In one aspect of the present inventive concept, there is provided a method of manufacturing a semiconductor device including preparing a substrate on which a first region and a second region are defined, forming a first active fin and a second active fin in the first and second regions, respectively, forming a first gate structure and a second gate structure on the substrate, the first and second gate structures crossing the first and second active fins, respectively, forming a first recess in the first active fin, is the first recess being adjacent to a sidewall of the first gate structure, forming a first epitaxial layer in the first recess, forming a first silicide layer on the first epitaxial layer, forming a second recess in the second active fin, the second recess being adjacent to a sidewall of the second gate structure, and forming a second silicide layer in the second recess, wherein the second silicide layer includes nickel (Ni) and platinum (Pt).

In another aspect of the present inventive concept, there is provided a method of manufacturing a semiconductor device including preparing a substrate on which a first region and a second region are defined, forming a first active fin and a second active fin in the first and second regions, respectively, forming a first gate structure and a second gate structure on the substrate, the first and second gate structures crossing the first and second active fins, respectively, forming a first recess in the first active fin, the first recess being adjacent to a sidewall of the first gate structure, forming a first epitaxial layer in the first recess, forming a first silicide layer on the first epitaxial layer, and converting a part of the second active fin into a second silicide layer, wherein the second silicide layer includes nickel (Ni) and platinum (Pt).

In still another aspect of the present inventive concept, there is provided a method of manufacturing a semiconductor device including preparing a substrate on which a first region and a second region are defined, forming a first active fin and a second active fin in the first and second regions, respectively, forming a first gate structure and a second gate structure on the substrate, the first and second gate structures crossing the first and second active fins, respectively, forming a first recess in at least a part of the first active fin, forming a first epitaxial layer in the first recess, forming a first silicide layer on the first epitaxial layer, forming a second epitaxial layer on at least a part of the second active fin, and converting at least parts of the second active fin and the second epitaxial layer into a second silicide layer, wherein the second silicide layer includes nickel (Ni) and platinum (Pt).

BRIEF DESCRIPTION OF THE DRAWINGS

The above and other features and aspects of the present inventive concept will be more apparent from the following detailed description taken in conjunction with the accompanying drawings, in which.

DETAILED DESCRIPTION OF THE EMBODIMENTS

Figure 1:
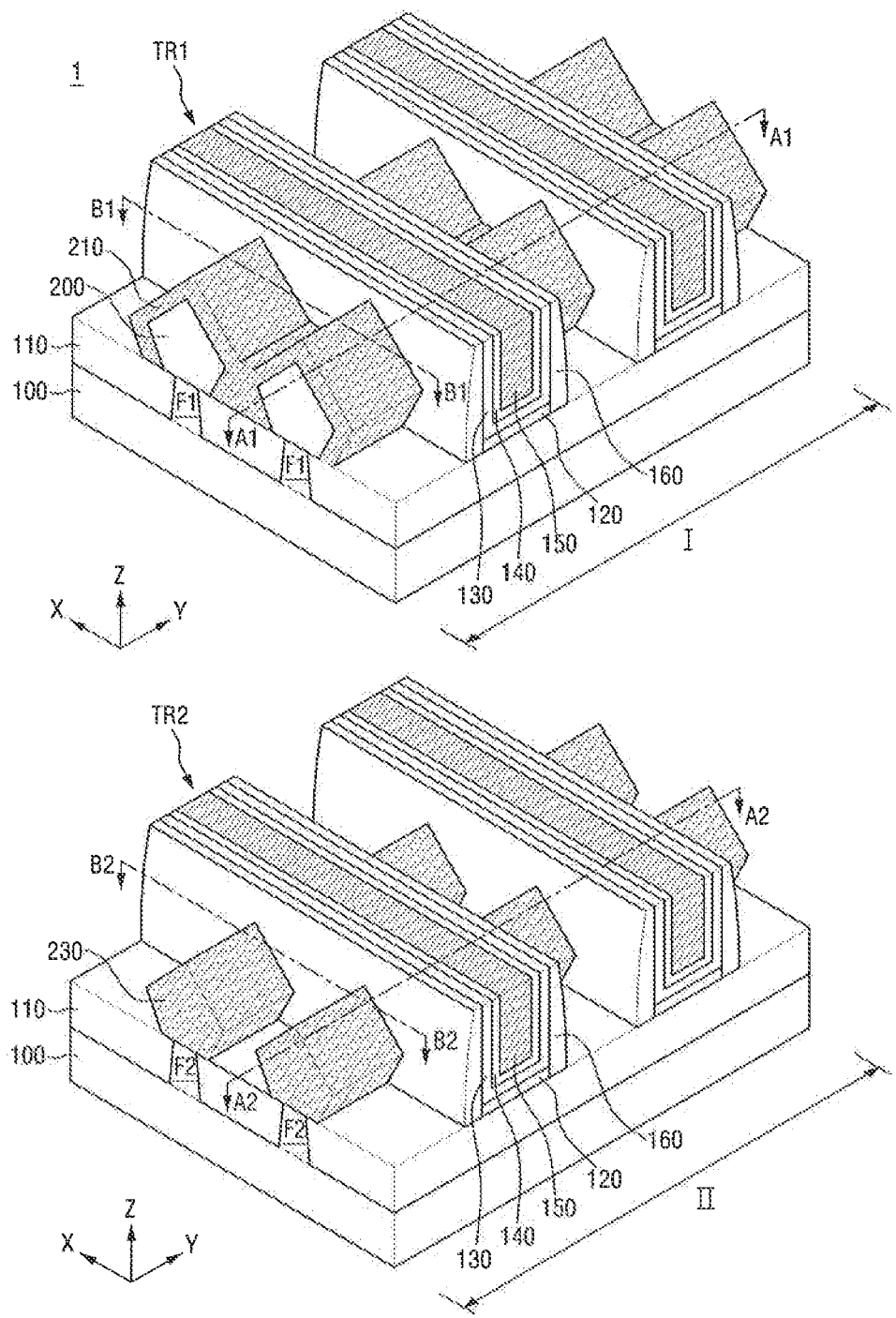
FIG. 1 is a perspective view of a semiconductor device according to an exemplary embodiment of the present inventive concept.

The present inventive concept will now be described more fully hereinafter with reference to the accompanying drawings, in which preferred embodiments of the inventive concept are shown. This present inventive concept may, however, be embodied in different forms and should not be construed as limited to the embodiments set forth herein. The same reference numbers may indicate the same components throughout the specification and drawings. In the attached figures, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the present inventive concept are to be construed to cover both the singular and the plural, unless otherwise indicated herein or clearly contradicted by context. The terms "comprising," "having," "including," and "containing" are to be construed as open-ended terms unless otherwise noted.

Unless defined otherwise, all technical and scientific terms used herein have the same meaning as commonly understood by one of ordinary skill in the art to which this present inventive concept belongs. It is noted that the use of any and all examples, or exemplary terms provided herein is intended merely to better illuminate the present inventive concept and is not a limitation on the scope of the present inventive concept unless otherwise specified. Further, unless defined otherwise, all terms defined in generally used dictionaries may not be overly interpreted.

The present inventive concept will be described with reference to perspective views, cross-sectional views, and/or plan views, in which preferred embodiments of the present inventive concept are shown. Thus, the profile of an exemplary view may be modified according to manufacturing techniques and/or allowances. That is, the embodiments of the present inventive concept are not intended to limit the scope of the present inventive concept but cover all changes and modifications that can be caused due to a change in manufacturing process. Thus, regions shown in the drawings are illustrated in schematic form and the shapes of the regions are presented simply by way of illustration and not as a limitation.

Hereinafter, a method of manufacturing a semiconductor device according to an exemplary embodiment of the present inventive concept will be described in more detail.

Figure 2:
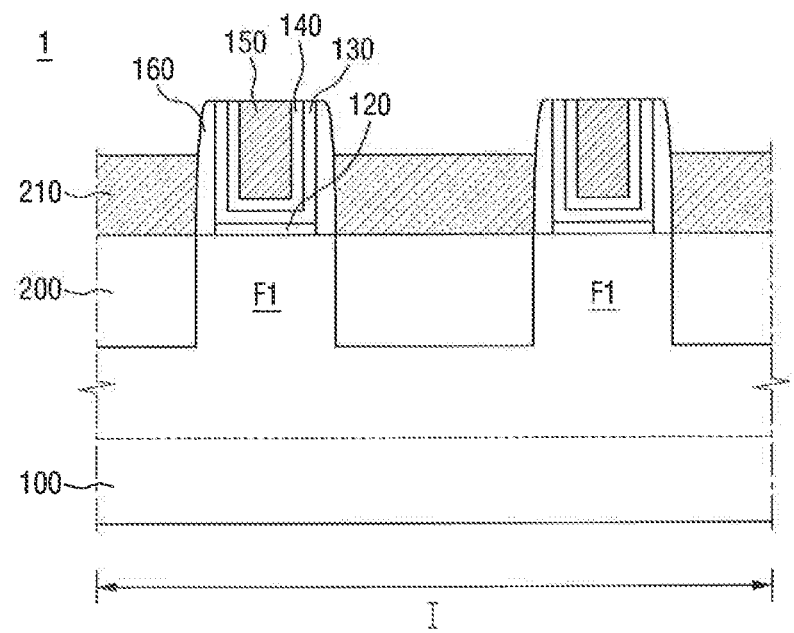
FIG. 2 is a cross-sectional view cut along lines A1-A1 and A2-A2 of FIG. 1.
Figure 2:
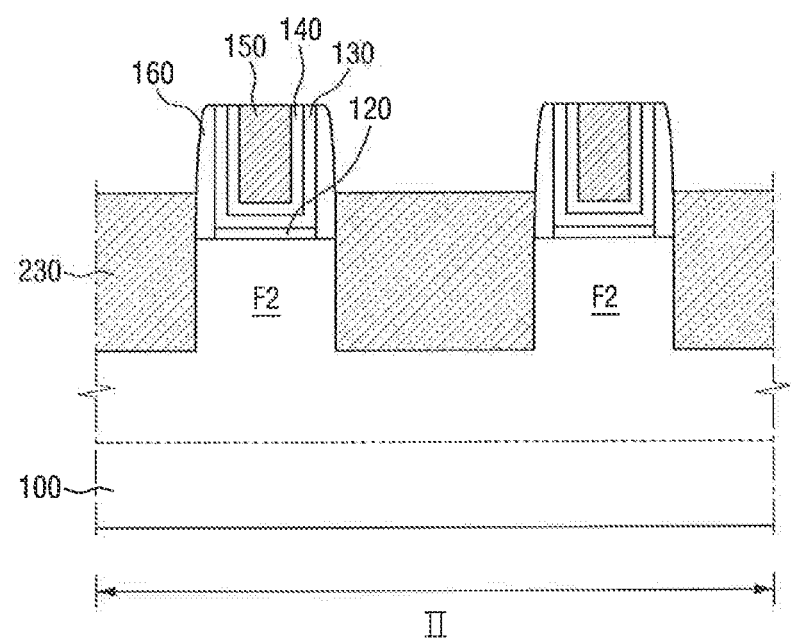
Figure 3:
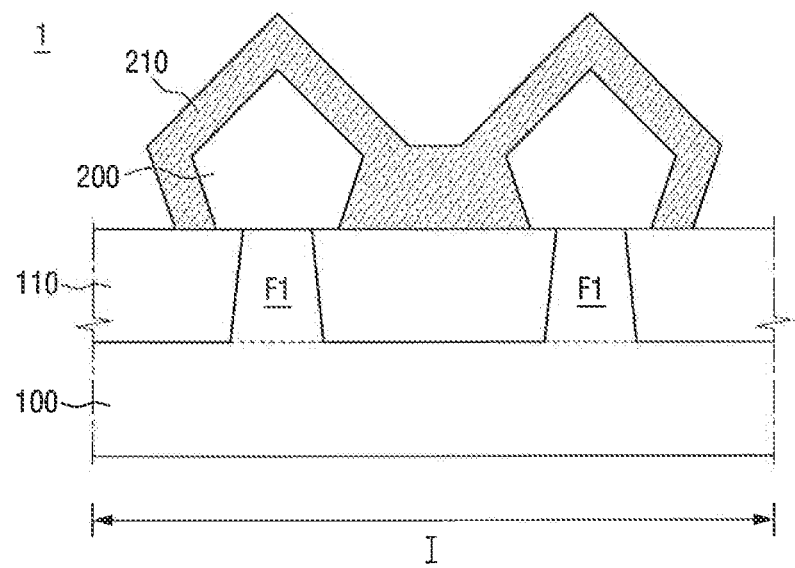
FIG. 3 is a cross-sectional view cut along lines B1-B1 and B2-B2 of FIG. 1.
Figure 3:
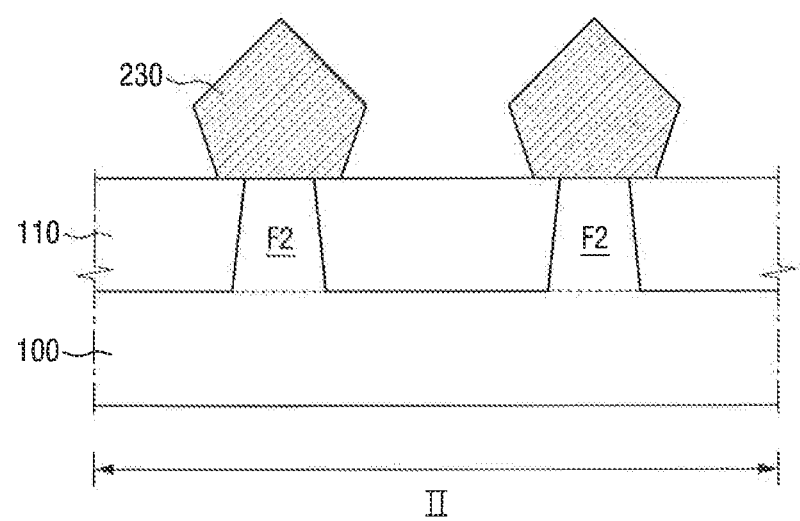

FIG. 1 is a perspective view of a semiconductor device according to an exemplary embodiment of the present inventive concept. FIG. 2 is a cross-sectional view cut along lines A1-A1 and A2-A2 of FIG. 1, and FIG. 3 is a cross-sectional view cut along lines B1-B1 and B2-B2 of FIG. 1. FIGS. 4 to 14 are views of intermediate steps of a method of manufacturing a semiconductor according to an exemplary embodiment of the present inventive concept.

First, referring to FIGS. 1 to 3, a semiconductor device 1 according to an exemplary embodiment of the present inventive concept includes a substrate 100, an isolation layer 110, a first active fin F1, a second active fin F2, a first gate structure TR1, a second gate structure TR2, a first epitaxial layer 200, a first silicide layer 210, and a second silicide layer 230.

The substrate 100 may be a rigid substrate, such as a silicon substrate, an SOI (Silicon On Insulator) substrate, a gallium arsenide substrate, a silicon germanium substrate, a ceramic substrate, a quartz substrate, or a glass substrate for display, or a flexible plastic substrate made of polyimide, polyester, polycarbonate, polyethersulfone, polymethylmethacrylate, polyethylene naphthalate, or polyethyleneterephthalate.

The substrate 100 may include a first region I and a second region II. The first region I and the second region II may be divided by the isolation layer F1, such as STI (Shallow Trench Isolation). Here, the first region I may be a PMOS region and the second region II may be an NMOS region, but exemplary embodiments of the present inventive concept are not limited thereto. The first region I may be an NMOS region and the second region II may be a PMOS region. However, for convenience in explanation, an exemplary embodiment of the present inventive concept will be described under the assumption that the first region I is the PMOS region and the second region II is the NMOS region.

The isolation layer F1 is formed on the substrate 100 and is used for device isolation. The isolation layer F1 is an insulating layer, and may be equal to an HDP oxide layer, and SOG oxide layer, or a CVD oxide layer, but is not limited thereto.

The first active fin F1 and the second active fin F2 are formed to project from the substrate 100. The first active fin F1 is formed in the first region I and the second active fin F2 is formed in the second region II. The first active fin F1 and the second active fin F2 may extend long along a second direction Y. The first active fin F1 and the second active fin F2 may be a part of the substrate 100. The isolation layer 110 may cover an upper surface of the substrate 100 and a part of side surfaces of the first and second active fins F1 and F2.

The first gate structure TR1 is formed on the first active fin F1 in a direction that crosses the first active fin F1. The first gate structure TR1 may extend long along a first direction X. The second gate structure TR2 is formed on the second active fin F2 in a direction that crosses the second active fin F2. The second gate structure TR2 may extend long along the first direction X.

Each of the first gate structure TR1 and the second gate structure TR2 may include an interface layer 120, a gate insulating layer 130, a work function adjustment layer 140, a gate metal 150, and a gate spacer 160, which are sequentially formed on the first active fin F1 and the second active fin F2. Through such a structure, channels may be formed on both side surfaces and upper surfaces of the first active fin F1 and the second active fin F2.

The interface layer 120 may be formed on the isolation layer 110 and the first and second active fins F1 and F2. The interface layer 120 may serve to prevent an inferior interface between the isolation layer 110 and the gate insulating layer 130. The interface layer 120 may include a low-k material layer of which the dielectric constant k is equal to or lower than 9, for example, a silicon oxide layer (where, k is approximately 4) or a silicon oxynitride layer (where, k is approximately 4 to 8 depending on the contents of oxygen atoms and nitrogen atoms). Further, the interface layer 120 may be made of silicate, or may be made of a combination of the above-exemplified layers.

The gate insulating layer 130 may be formed on the interface layer 120. However, in the case where the interface layer 120 does not exist, the gate insulating layer 130 may be formed on the isolation layer 110 and the first and second active fins F1 and F2. The gate insulating layer 130 may include a high-k material. Specifically, the gate insulating layer 130 may include HfSiON, $HfO_2$, $ZrO_2$, $Ta_2O_5$, $TiO_2$, $SrTiO_3$, $BaTiO_3$, and/or $SrTiO_3$. On the other hand, the gate insulating layer 130 may be formed with an appropriate thickness depending on the kind of the device to be formed. For example, in the case where the gate insulating layer 130 is $HfO_2$, the gate insulating layer 130 may be formed with a thickness equal to or smaller than 50 Å (approximately 5 Å to 50 Å), but exemplary embodiments of the present inventive concept are not limited thereto. In some embodiments of the present inventive concept, as illustrated in FIG. 1, the gate insulating layer 130 may extend upward along a side wall of the gate spacer 160 to be described later.

The work function adjustment layer 140 may be formed on the gate insulating layer 130. The work function adjustment layer 140 may be formed to come in contact with the gate insulating layer 130. The work function adjustment layer 140 is used for work function adjustment. The work function adjustment layer 140 may include, for example, metal nitride. Specifically, the work function adjustment layer 140 may include at least one of Mo, Pd, Ru, Pt, TiN, WN, TaN, Ir, TaC, RuN, TiAl, TaAlC, TiAlN, and MoN. More specifically, the work function adjustment layer 140 may be formed of, for example, a single layer made of TiN or a double layer composed of a lower TiN layer and an upper TaN layer, but exemplary embodiments of the present inventive concept are not limited thereto. On the other hand, a capping layer may be formed between the gate insulating layer 130 and the work function adjustment layer 140. The capping layer may be used for the work function adjustment. Specifically, the capping layer serves as a buffer between the gate insulating layer 130 and the work function adjustment layer 140, and in the case where the capping layer exists, the work function can be adjusted more precisely in comparison to a case where only the work function adjustment layer 140 exists. The capping layer may include, for example, at least one of LaO, GdO, DyO, SrO, BaO, aluminum oxide, and aluminum metal oxide, but exemplary embodiments of the present inventive concept are not limited thereto. In some embodiments of the present inventive concept, as illustrated in FIG. 1, the work function adjustment layer 140 may also extend upward along the side wall of the gate spacer 160 to be described later.

The gate metal 150 may be formed on the work function adjustment layer 140. As illustrated, the gate metal 150 may be formed to come in contact with the work function adjustment layer 140. That is, the gate metal 150 may be formed to fill a space that is created by the work function adjustment layer 140. The gate metal 150 may include a conductive material, for example, W or Al, but is not limited thereto.

The gate spacer 160 may be formed on at least one side of side surfaces of the first and second gate structures TR1 and TR2. The gate spacer 160 may include at least one of a nitride layer, an oxynitride layer, and a low-k material layer. Further, it is illustrated that the gate spacer 160 has one curved side surface. However, the present inventive concept is not limited thereto, and the shape of the gate spacer 160 may differ from that as described above. For example, unlike that as illustrated, the gate spacer 160 may be formed in "T" shape or in "L" shape. Further, it is illustrated in the drawing that the gate spacer 160 is formed as a single layer. However, the present inventive concept is not limited thereto, and the gate spacer 160 may be formed as a multilayer.

A source/drain may be formed on at least one of both sides of the first and second gate structures TR1 and TR2, and may be formed in the first and second active fins F1 and F2. The source/drain and the first and second gate structures TR1 and TR2 may be insulated by the gate spacer 160.

The first epitaxial layer 200 is formed to fill a first recess R1 formed in at least a part of the first active fin F1. Further, as illustrated in FIG. 1, the first epitaxial layer 200 may be formed on the first active fin F1 in which the first recess R1 is formed. Through the first epitaxial layer 200, compressive stress may be provided to the channel region of the first region I. Accordingly, the first epitaxial layer 200 may be formed of a material having higher lattice constant that the lattice constant of the substrate 100, and for example, if the substrate 100 is made of silicon (Si), the first epitaxial layer 200 may include SiGe. However, the present inventive concept is not limited thereto.

The first silicide layer 210 is formed on the first epitaxial layer 200. The first silicide layer 210 serves to increase the degree that the first epitaxial layer 200 provides the compressive stress to the channel region of the first region I. However, the first silicide layer 210 may be formed to merge the adjacent first active fins F1. As the first silicide layer 210 is formed to merge the adjacent first active fins F1, relaxation of the compressive stress that is provided by the first epitaxial layer 200 can be reduced. The first silicide layer 210 may include Si, which may be formed by performing an annealing process after a capping layer 205 is formed on the first epitaxial layer 200. This process will be described in more detail below.

The second silicide layer 230 is formed to fill a second recess R2 that is formed in at least a part of the second active fin F2. Further, as illustrated in FIG. 1, the second silicide layer 230 may be formed on the second active fin F2 in which the second recess R2 is formed. The second silicide layer 230 serves to provide a tensile stress to the channel region of the second region II. In particular, the second silicide layer 230 includes $(Ni(1-x)Pt(x))Si$ ($0<x<1$). In this case, the second silicide layer 230 provides high tensile stress to the channel region of the second region II. The degree that the second silicide layer 230 formed in the second region II provides the tensile stress to the channel region may be determined according to the thickness of the second silicide layer 230 and a gap distance between the second silicide layer 230 and the channel region. In other words, as the second silicide layer 230 is formed nearer to the channel region, higher tensile stress can be provided to the channel region. The second silicide layer 230 may be formed by growing the second epitaxial layer 225 in the second recess R2, forming a metal layer 226 on the second epitaxial layer 225, and performing an annealing process. This will be described later.

Referring to FIGS. 4 to 14, a method of manufacturing a semiconductor device according to an exemplary embodiment of the present inventive concept will be described.

Figure 4:
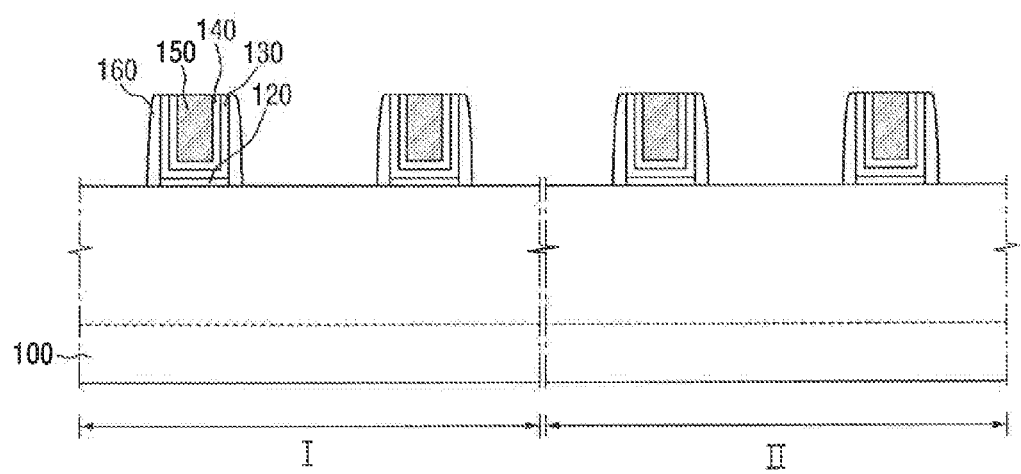
FIGS. 4 to 14 are views of intermediate steps of a method of manufacturing a semiconductor according to an exemplary embodiment of the present inventive concept.

Referring to FIGS. 1 and 4, the substrate 100, on which the first region I and the second region II are defined, is first prepared, and the first active fin F1 and the second active fin F2 are formed on the first region I and the second region II, respectively. Then, the first gate structure TR1 and the second gate structure TR2 are formed on the substrate 200 in a direction X that crosses the first and second active fins F1 and F2.

Figure 5:
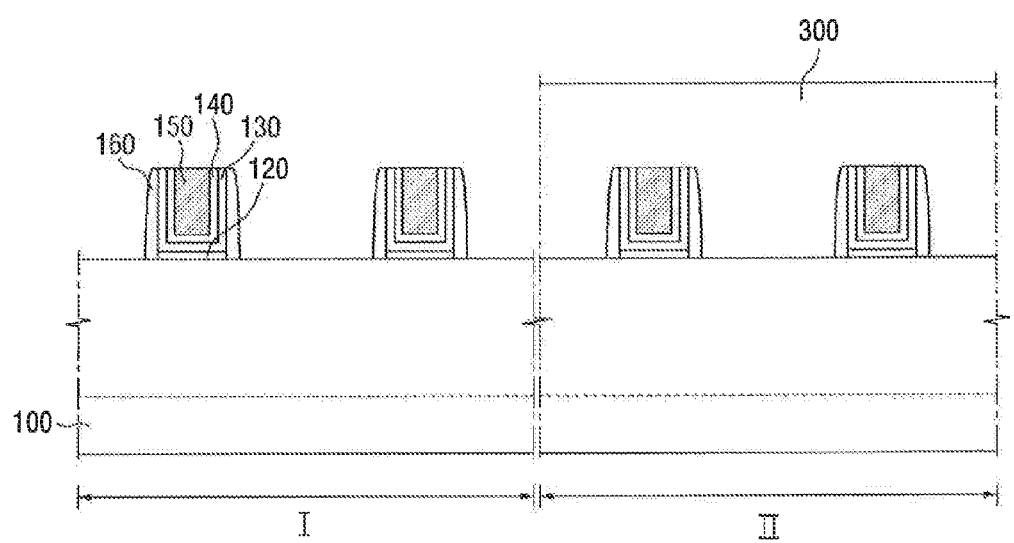
Figure 6:
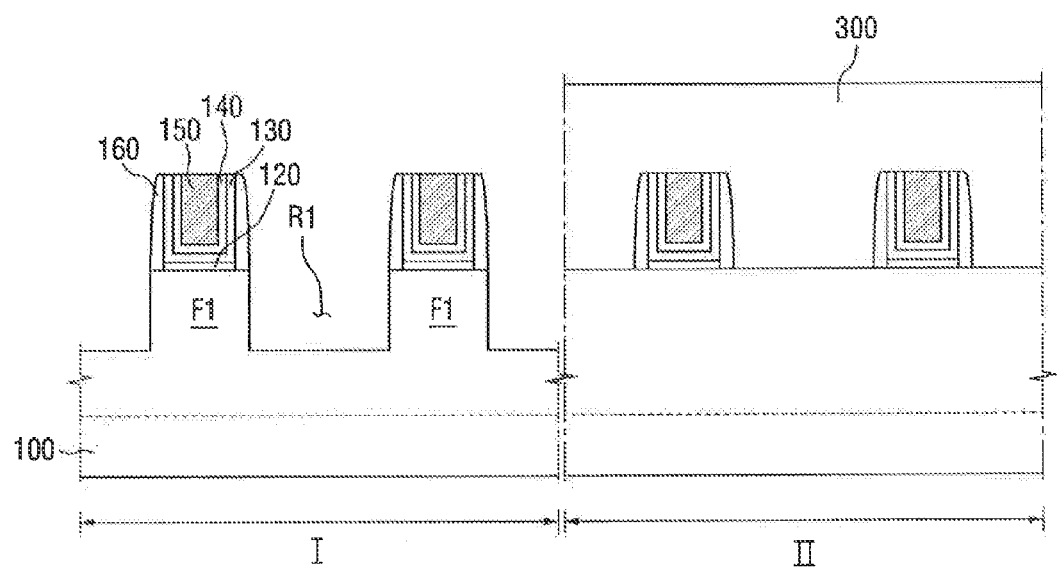

Referring to FIGS. 5 and 6, a first mask layer 300 is formed to cover the second region II, and the first recess R1 is formed in at least a part of the first active fin F1 that is adjacent to one side surface of the first gate structure TR1 in the first region I. A part of the first active fin F1 may be etched to form the first recess R1.

Figure 7:
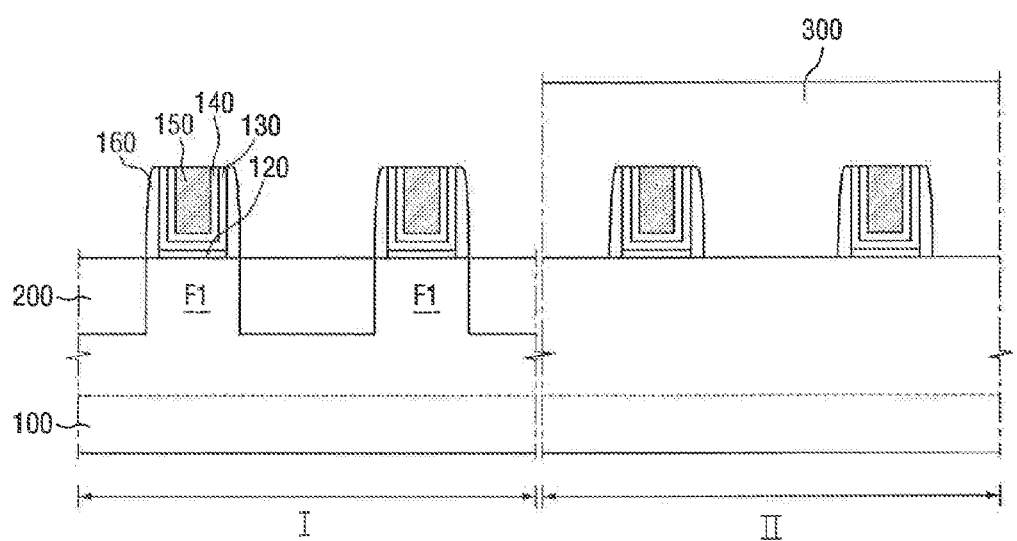

Referring to FIG. 7, the first epitaxial layer 200 is formed in the first recess R1. The first epitaxial layer 200 is formed to provide the compressive stress to the channel region that is positioned on the lower portion of the first gate structure TR1 formed in the first region I. Accordingly, the first epitaxial layer 200 may be formed of a material having high lattice constant, and for example, if the substrate 100 is made of Si, the first epitaxial layer 200 may include SiGe. However, the present inventive concept is not limited thereto. The first epitaxial layer 200 may be formed through an SEG (Selective Epitaxial Growth) process.

Since the first epitaxial layer 200 should provide the compressive stress to the channel region the first epitaxial layer 200 may cover both side surfaces of the channel region. Since the channel region is arranged on a lower surface of the first gate structure TR1, the upper surface of the first epitaxial layer 200 may be higher than the lower surface of the first gate structure TR1 or may be at least equal to the lower surface of the first gate structure TR1.

Figure 8:
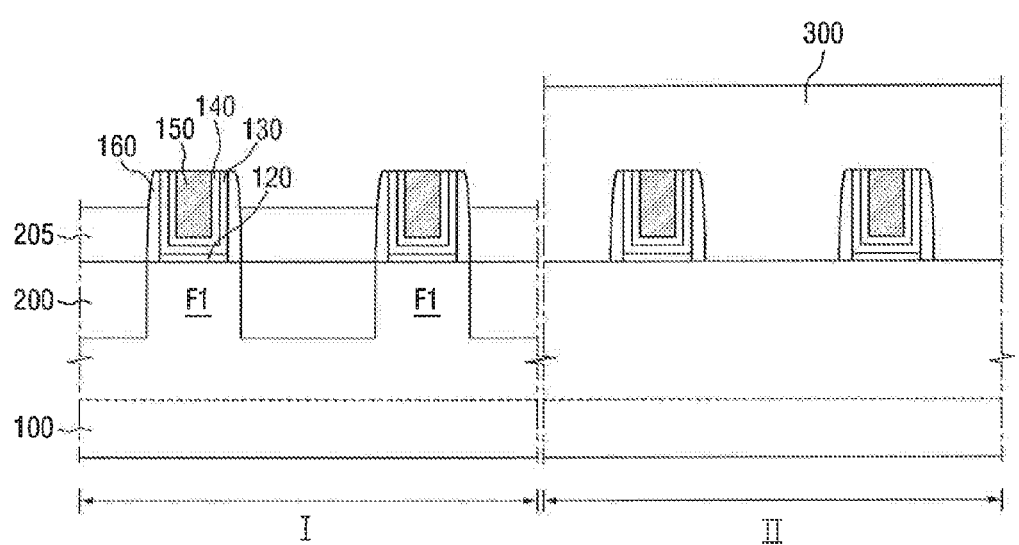

Referring to FIG. 8, the capping layer 205 is formed on the first epitaxial layer 200. The capping layer 205 may become the first silicide layer 210 through the following annealing process. The capping layer 205 may include Si, but exemplary embodiments of the present inventive concept are not limited thereto. The capping layer 205 may be formed to merge the adjacent first active fins F1.

Figure 9:
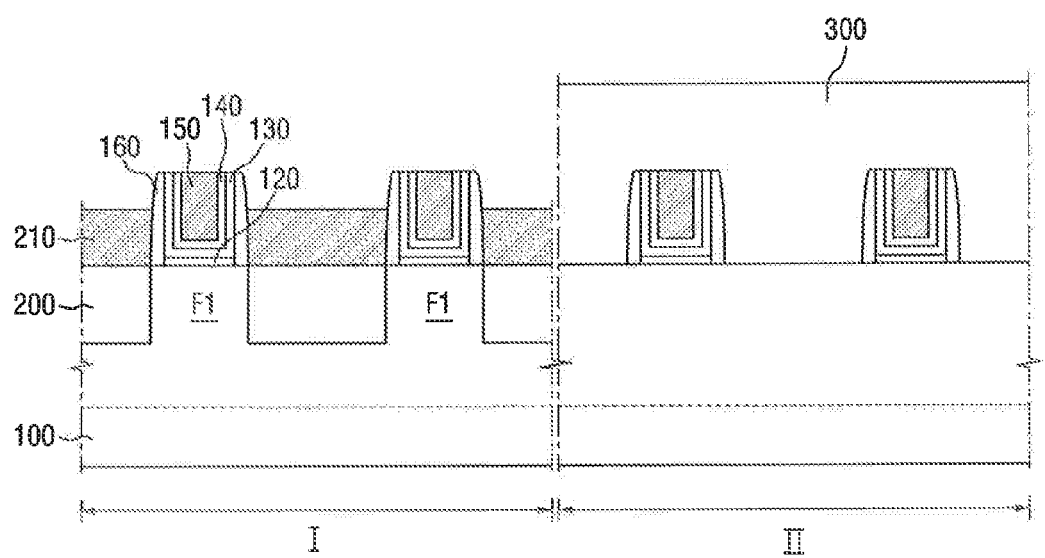
Figure 10:
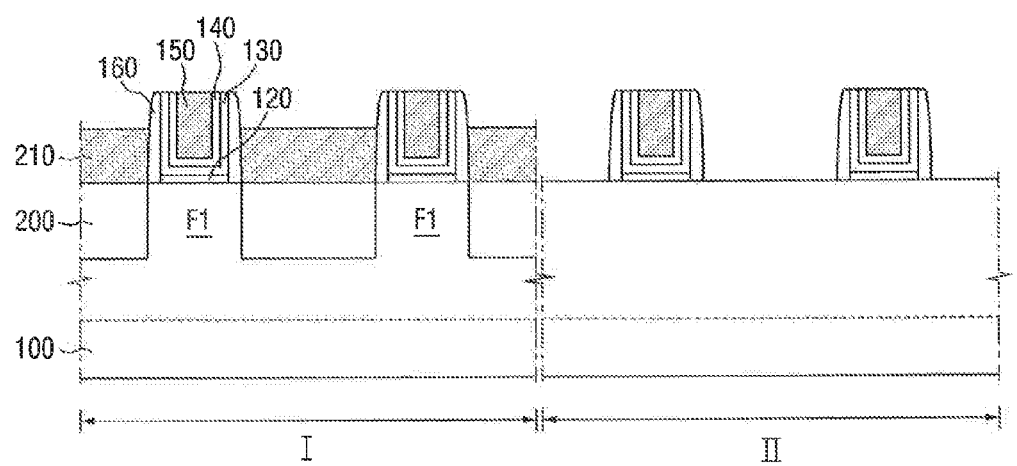
Figure 11:
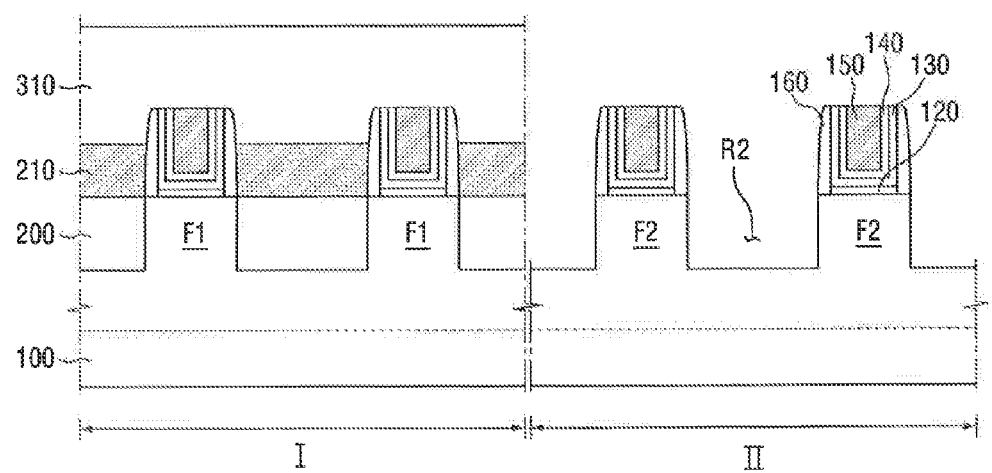

Referring to FIG. 9, a first annealing process is performed to convert the capping layer 205 into the first silicide layer 210. If the capping layer 205 includes Si, the first silicide layer 210 also includes Si.

Referring to FIG. 9, after the first epitaxial layer 200 and the first silicide layer 210 are formed in the first region I, the first mask layer 300 that covers the second region II is removed. Then, referring to FIG. 11, a second mask layer 310 is formed to cover the first region I, and the second recess R2 is formed in at least a part of the second active fin F2 that is adjacent to one side surface of the second gate structure TR2 in the second region. A part of the second active fin F2 may be etched to form the second recess R2.

Figure 12:
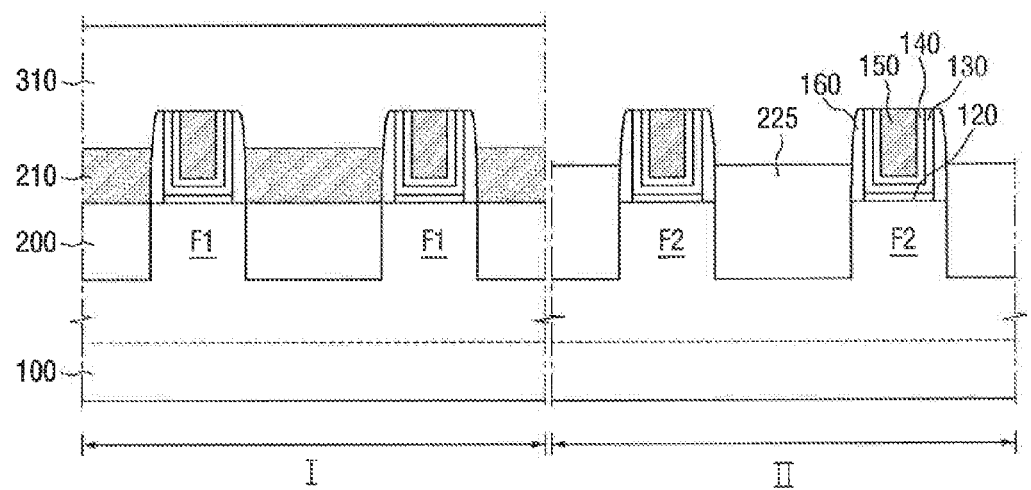

Referring to FIG. 12, the second epitaxial layer 225 is formed in the second recess R2. The second epitaxial layer 225 is formed to provide the tensile stress to the channel region that is positioned on the lower portion of the second gate structure TR2 formed in the second region II. An NMOS transistor is formed in the second region II, and since the NMOS transistor operates by means of electrons, it is preferable to apply the tensile stress to the substrate 100. In order to apply the tensile stress, the second epitaxial layer 225 may be formed of a material having lower lattice constant than the lattice constant of the substrate 100. For example, if the substrate 100 is made of Si, the second epitaxial layer 225 may include SiP having lower lattice constant that the lattice constant of Si. However, the present inventive concept is not limited thereto. The second epitaxial layer 225 may be formed through an SEG (Selective Epitaxial Growth) process.

Since the second epitaxial layer 225 may provide the tensile stress to the channel region, the second epitaxial layer 225 may cover both side surfaces of the channel region. Since the channel region is arranged on the lower surface of the second gate structure TR2, the upper surface of the second epitaxial layer 225 may be higher than the lower surface of the second gate structure TR2 or may be at least equal to the lower surface of the second gate structure TR2.

Figure 13:
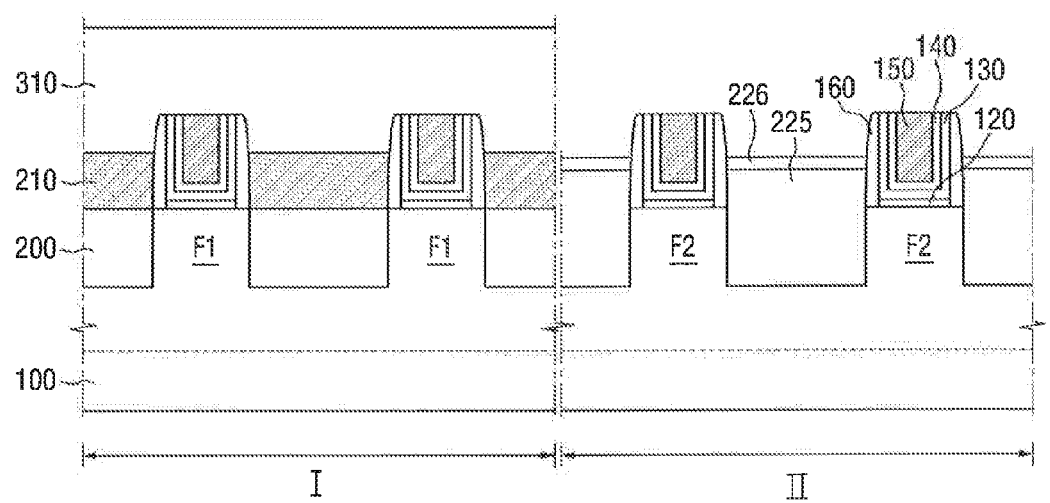

Referring to FIG. 13, the metal layer 226 is formed on the second epitaxial layer 225. The metal layer 226 may convert the second epitaxial layer 225 into the second silicide layer 230 through the following annealing process.

The second annealing process for forming the second silicide layer 230 may be performed in a short time. If a relatively large amount of time has passed in a state where the second epitaxial layer 225 and the metal layer 226 are liquefied, materials included in the metal layer 226 may be diffused into the second gate structure TR2 and may cause malfunction of the transistor. Accordingly, the second annealing process may be performed in a short time, for example, for 10 µs to 10 ms.

The metal layer 226 may include, for example, Ni, Pt, and NiPt. If the metal layer 226 includes NiPt, the second silicide layer 230 may include $(Ni(1-x)Pt(x))Si$ $(0<x<1)$ through the second annealing process. In this case, the processing temperature of the second annealing process for forming the second silicide layer 230 may differ according to Pt contents. For example, if the Pt contents are 5%, the processing temperature in the second annealing process may be equal to or higher than 1100° C., and if the Pt contents are 10%, the processing temperature in the second annealing process may be equal to or higher than 1150° C. Further, during performing of the second annealing process, the temperature of the substrate 100 may be kept equal to or higher than 400° C. It may be desired to suppress the dissipation of heat generated in the second annealing process in a short time through the substrate 100 that is in a high-temperature state. The structure of the second silicide layer 230 according to the present inventive concept is thermally stable, and has uniform structural characteristics.

Figure 14:
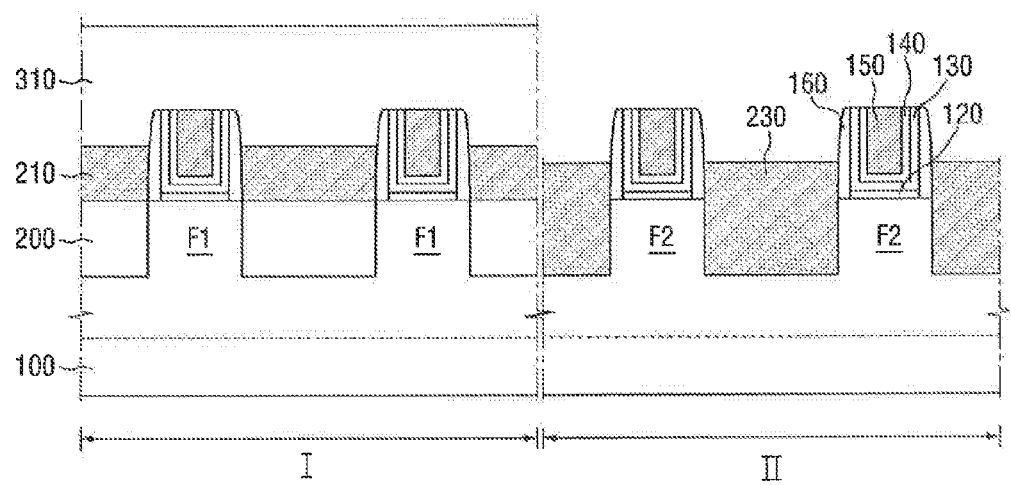

Referring to FIG. 14, the second silicide layer 230 is formed through the second annealing process. The upper surface of the second silicide layer 230 that is formed in the second region II may be lower than the upper surface of the first silicide layer 210 that is formed in the first region I.

Hereinafter, a method of manufacturing a semiconductor device according to other embodiments of the present inventive concept will be described.

Figure 15:
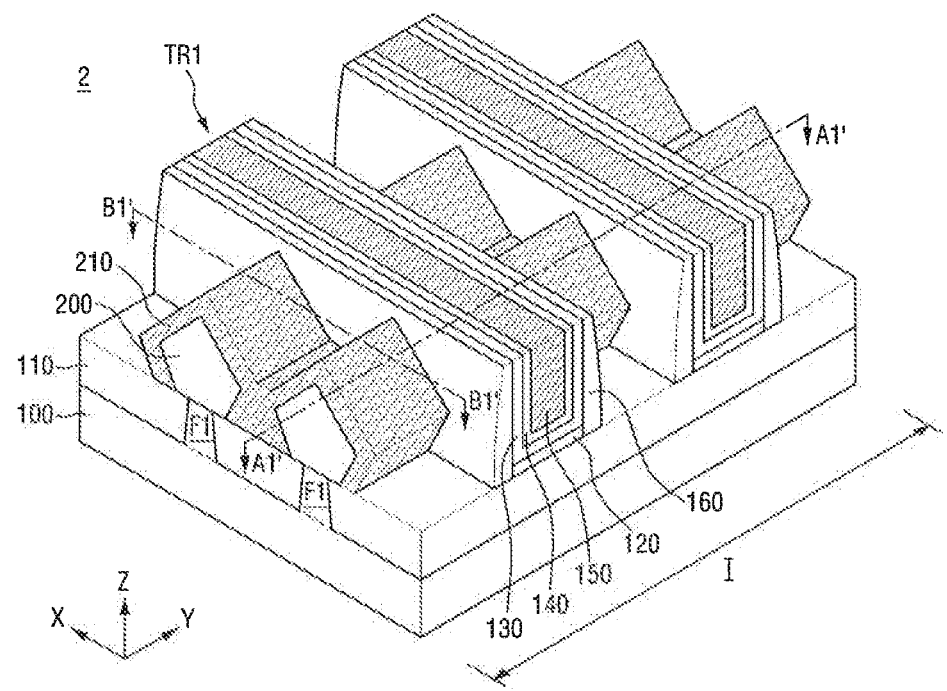
FIG. 15 is a perspective view of a semiconductor device according to an exemplary embodiment of the present inventive concept.
Figure 15:
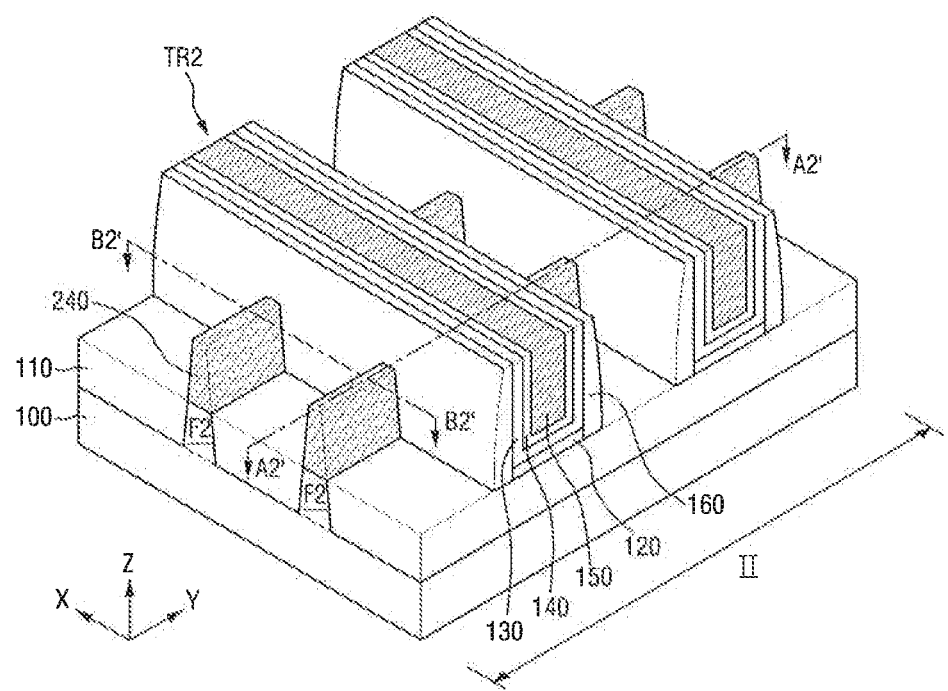
Figure 16:
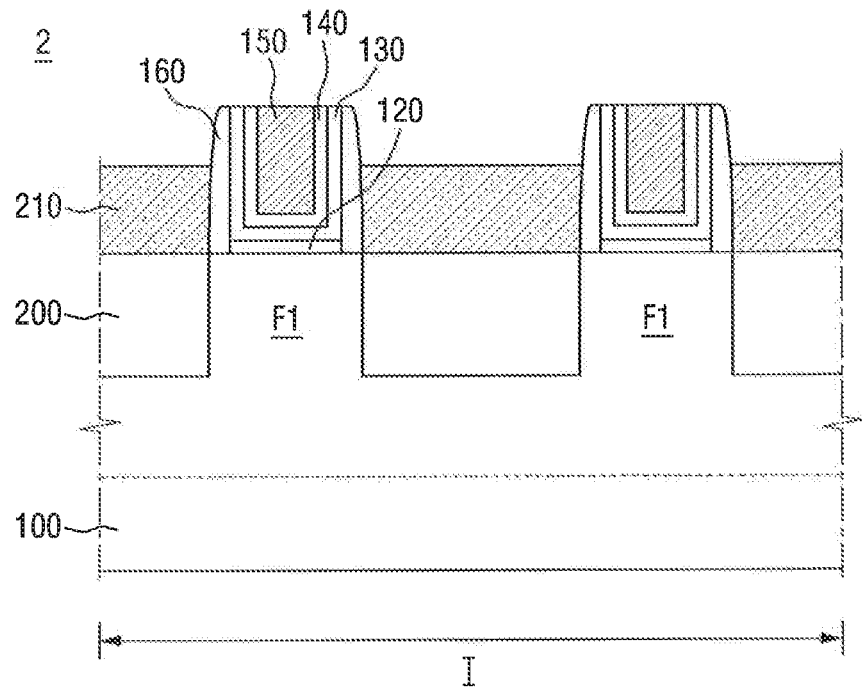
FIG. 16 is a cross-sectional view cut along lines A1'-A1' and A2'-A2' of FIG. 15.
Figure 16:
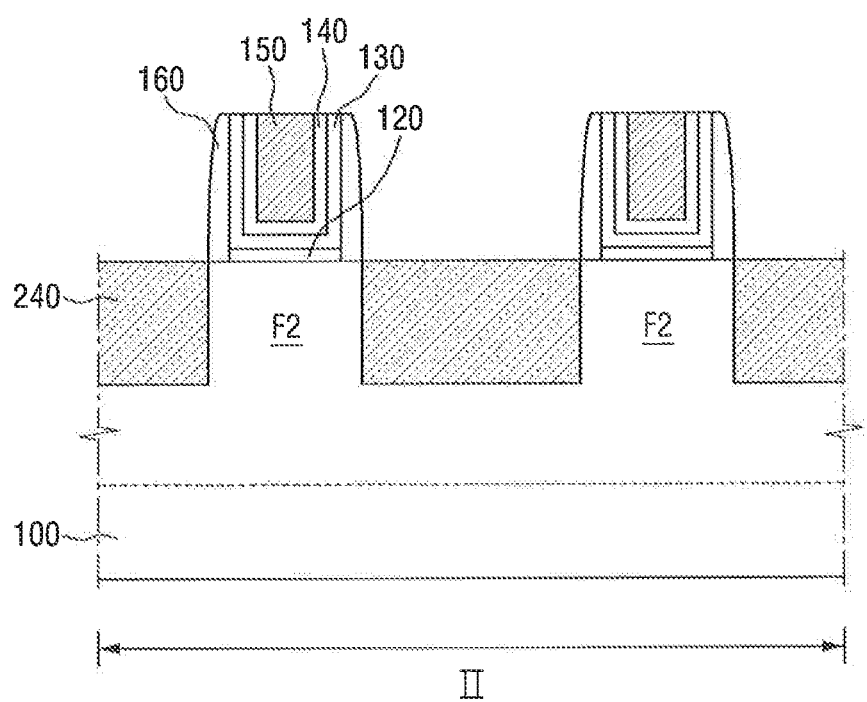
Figure 17:
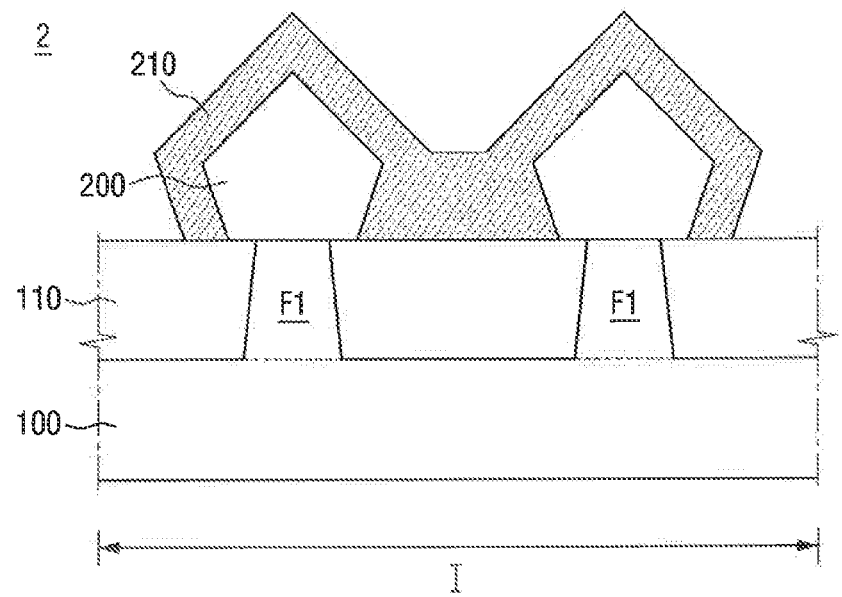
FIG. 17 is a cross-sectional view cut along lines B1'-B1' and B2'-B2' of FIG. 15.
Figure 17:
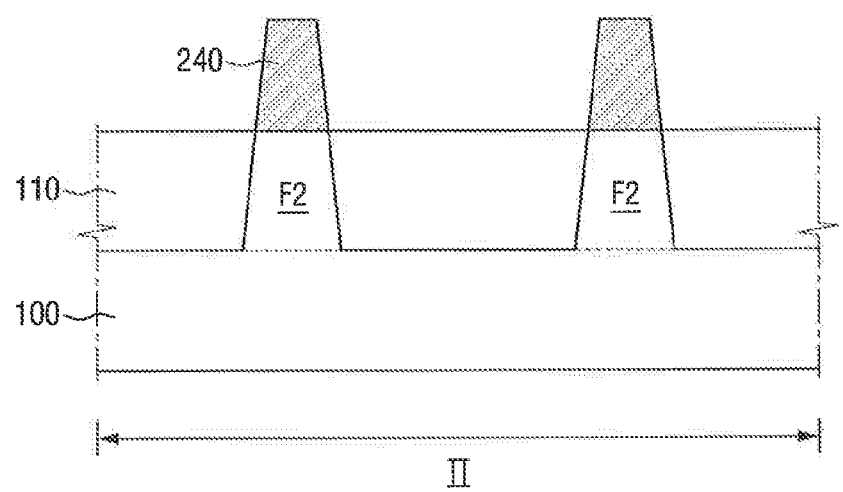
Figure 18:
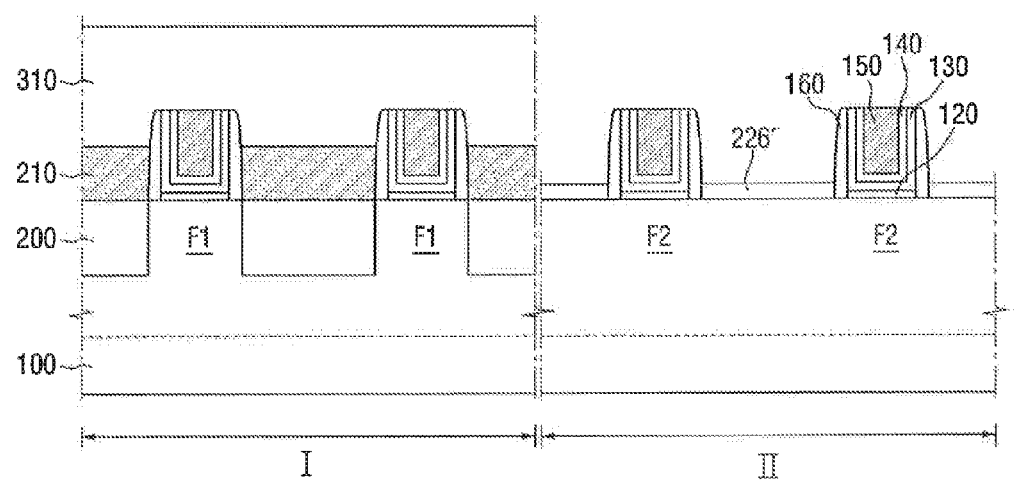
FIGS. 18 and 19 are views of intermediate steps of a method of manufacturing a semiconductor according to an exemplary embodiment of the present inventive concept.
Figure 19:
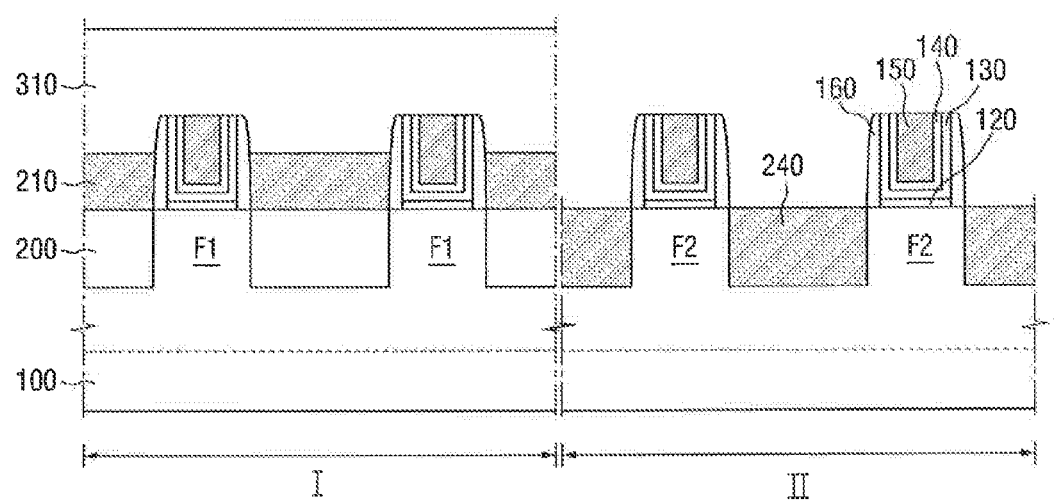

FIG. 15 is a perspective view of a semiconductor device according to an exemplary embodiment of the present inventive concept. FIG. 16 is a cross-sectional view cut along lines A1'-A1' and A2'-A2' of FIG. 15, and FIG. 17 is a cross-sectional view cut along lines B1'-B1' and B2'-B2' of FIG. 15. FIGS. 18 and 19 are views of intermediate steps of a method of manufacturing a semiconductor according to an exemplary embodiment of the present inventive concept. For convenience in explanation, description of the portions substantially the same as those as described above in the method of manufacturing a semiconductor device according to an exemplary embodiment of the present inventive concept will be omitted.

Referring to FIGS. 15 to 17, a semiconductor device 2 according to an exemplary embodiment of the present inventive concept includes a substrate 100, an isolation layer 110, a first active fin F1, a second active fin F2, a first gate structure TR1, a second gate structure TR2, a first epitaxial layer 200, a first silicide layer 210, and a second silicide layer 240.

Here, the substrate 100, the isolation layer 110, the first active fin F1, the second active fin F2, the first gate structure TR1, the second gate structure TR2, the first epitaxial layer 200, and the first silicide layer 210 are substantially the same as those as described above.

Referring to FIGS. 18 and 19, in the semiconductor device 2 according to an exemplary embodiment, the second silicide layer 240 is formed through conversion of at least a part of the second active fin F2. That is, the second silicide layer 240 may be formed on the second active fin F2 by forming a metal layer 226' on the second active fin F2 and performing an annealing process without recessing the second active fin F2. In the same manner as that as described above, the second silicide layer 240 serves to provide a tensile stress to the channel region of the second region II. In particular, the second silicide layer 240 may include (Ni(1-x)Pt(x))Si (0<x<1). In this case, the second silicide layer 240 provides high tensile stress to the channel region of the second region II.

The annealing process for forming the second silicide layer 240 may be performed in a short time. That is, the annealing process for forming the second silicide layer 240 may be performed, for example, for 10 μs to 10 ms.

The metal layer 226' may include, for example, Ni, Pt, and NiPt. If the metal layer 226' includes NiPt, the second silicide layer 240 may include (Ni(1-x)Pt(x))Si (0<x<1) through the annealing process. In this case, the processing temperature of the annealing process for forming the second silicide layer 240 may differ according to Pt contents. For example, if the Pt contents are 5%, the processing temperature in the annealing process may be equal to or higher than 1100° C., and if the Pt contents are 10%, the processing temperature in the annealing process may be equal to or higher than 1150° C. Further, during performing of the annealing process, the temperature of the substrate 100 may be kept equal to or higher than 400° C.

Figure 20:
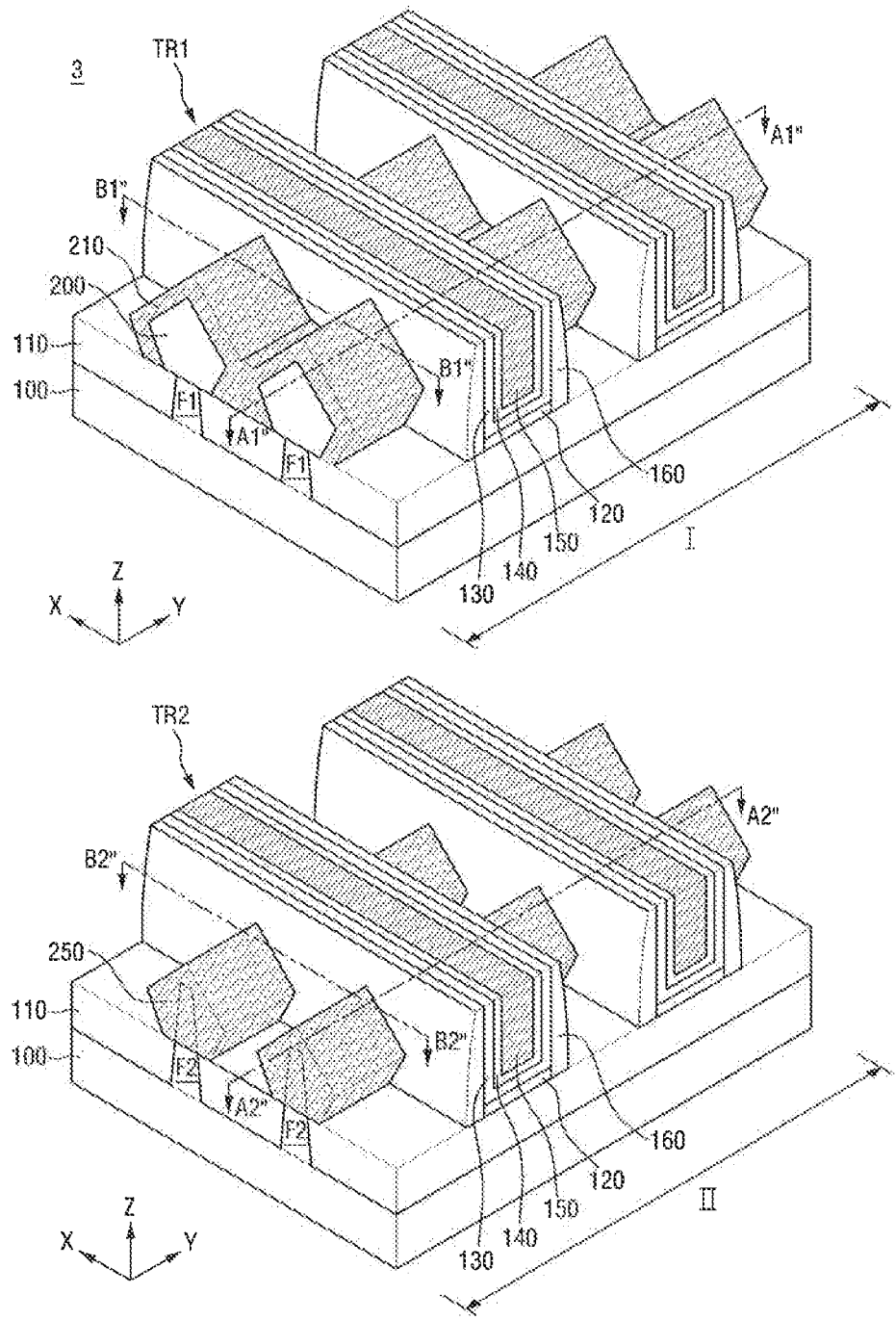
FIG. 20 is a perspective view of a semiconductor device according to an exemplary embodiment of the present inventive concept.
Figure 21:
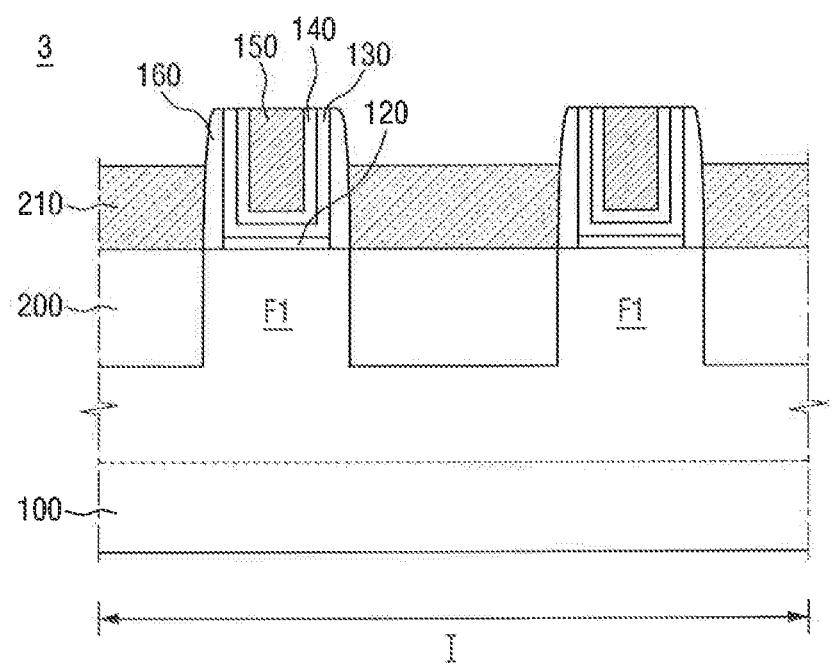
FIG. 21 is a cross-sectional view cut along lines A1"-A1" and A2"-A2" of FIG. 20.
Figure 21:
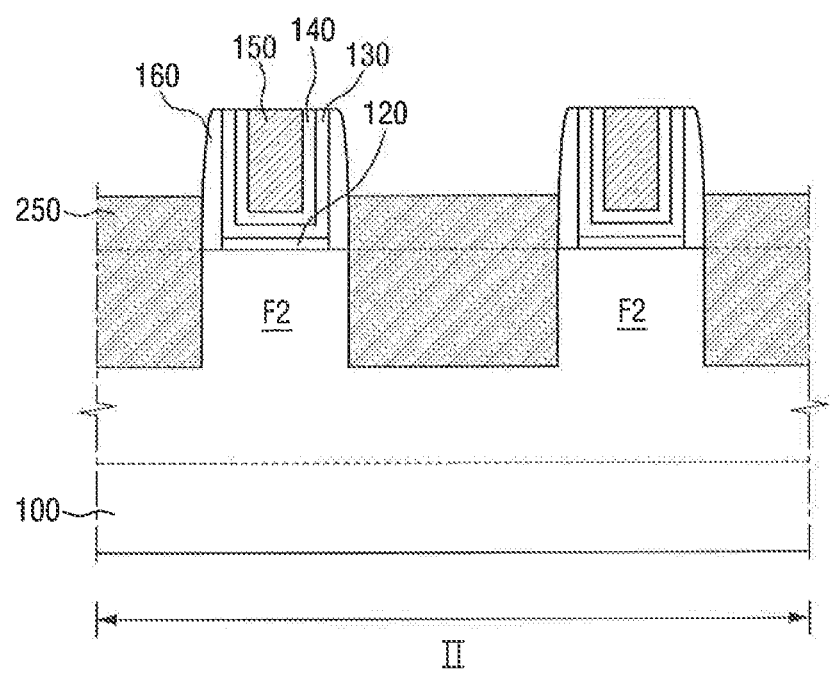
Figure 22:
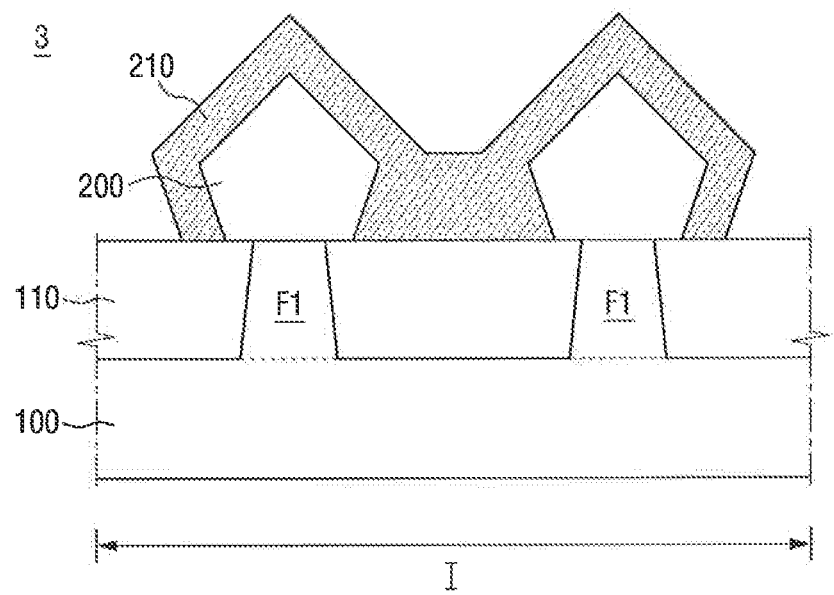
FIG. 22 is a cross-sectional view cut along lines B1"-B1" and B2"-B2" of FIG. 20.
Figure 22:
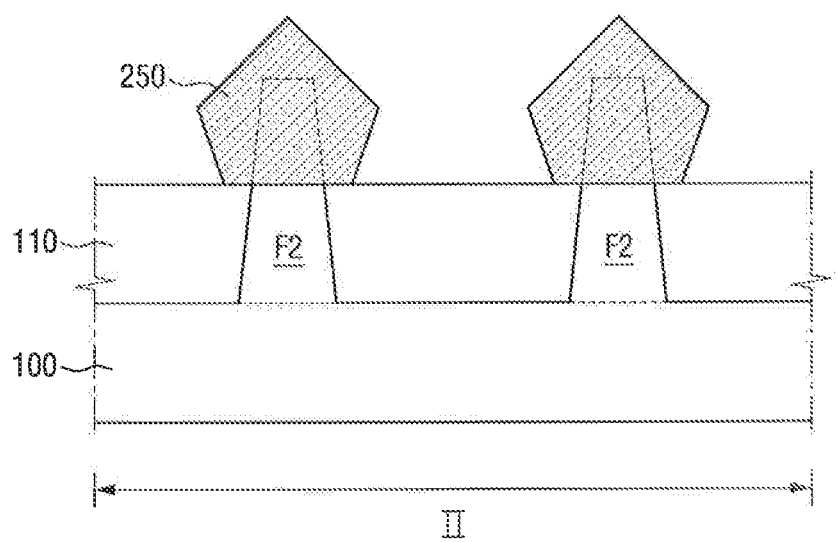
Figure 23:
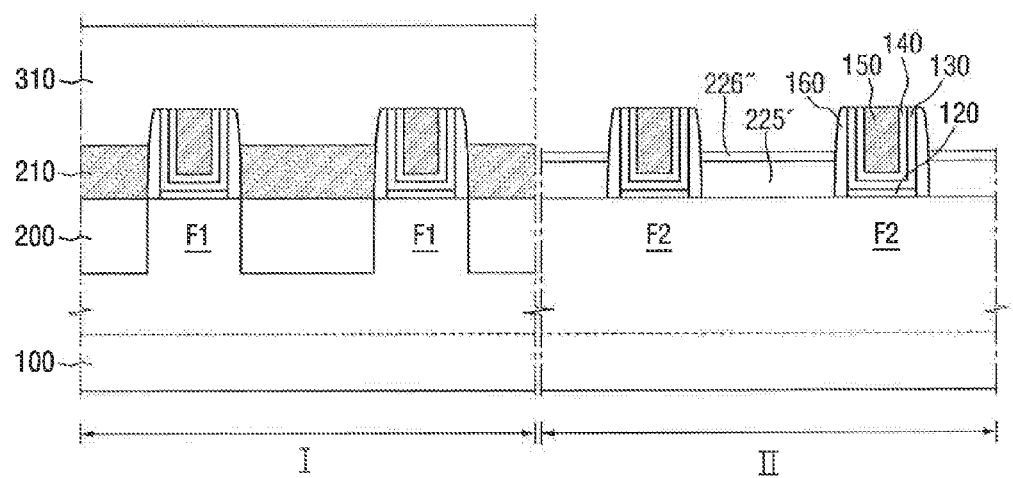
FIGS. 23 and 24 are views of intermediate steps of a method of manufacturing a semiconductor according to an exemplary embodiment of the present inventive concept.
Figure 24:
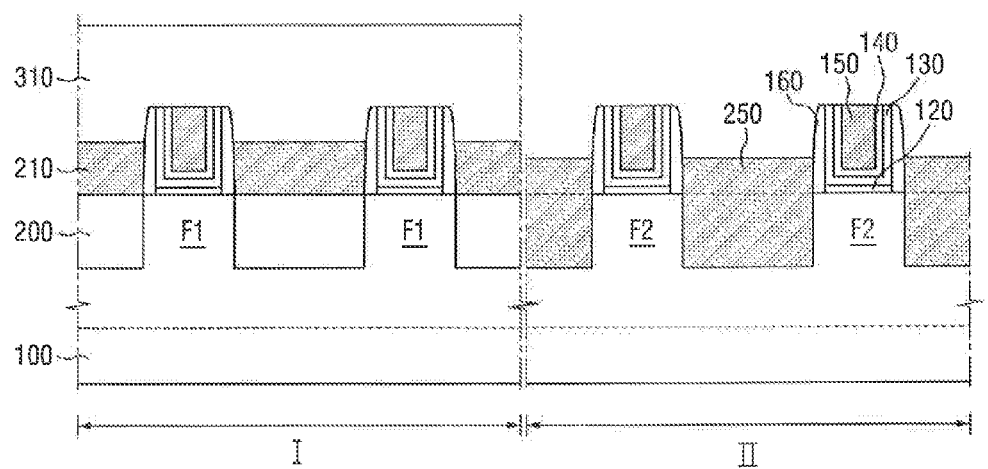

FIG. 20 is a perspective view of a semiconductor device according to an exemplary embodiment of the present inventive concept. FIG. 21 is a cross-sectional view cut along lines A1"-A1" and A2"-A2" of FIG. 20, and FIG. 22 is a cross-sectional view cut along lines B1"-B1" and B2"-B2" of FIG. 20. FIGS. 23 and 24 are views of intermediate steps of a method of manufacturing a semiconductor according to an exemplary embodiment of the present inventive concept. For convenience in explanation, description of the portions substantially the same as those as described above in the method of manufacturing a semiconductor device according to an exemplary embodiment of the present inventive concept will be omitted.

Referring to FIGS. 20 to 22, a semiconductor device 3 according to an exemplary embodiment of the present inventive concept includes a substrate 100, an isolation layer 110, a first active fin F1, a second active fin F2, a first gate structure TR1, a second gate structure TR2, a first epitaxial layer 200, a first silicide layer 210, and a second silicide layer 250.

Here, the substrate 100, the isolation layer 110, the first active fin F1, the second active fin F2, the first gate structure TR1, the second gate structure TR2, the first epitaxial layer 200, and the first silicide layer 210 are substantially the same as those as described above.

Referring to FIGS. 23 and 24, in the semiconductor device 3 according to an exemplary embodiment, the second silicide layer 250 is formed by forming a second epitaxial layer 225' on at least a part of the second active fin F2 and converting at least parts of the second active fin F2 and the second epitaxial layer 225'. That is, the second silicide layer 250 may be formed on the second active fin F2 by forming the second epitaxial layer 225' on the second active fin F2, forming a metal layer 226" on the second epitaxial layer 225', and performing an annealing process without recessing the second active fin F2. In the same manner as that as described above, the second silicide layer 250 serves to provide a tensile stress to the channel region of the second region II. In particular, the second silicide layer 250 may include (Ni(1-x)Pt(x))Si (0<x<1). In this case, the second silicide layer 250 provides high tensile stress to the channel region of the second region II.

The annealing process for forming the second silicide layer 250 may be performed in a short time. That is, the annealing process for forming the second silicide layer 250 may be performed, for example, for 10 μs to 10 ms.

The metal layer 226" may include, for example, Ni, Pt, and NiPt. If the metal layer 226" includes NiPt, the second silicide layer 250 may include (Ni(1-x)Pt(x))Si (0<x<1) through the annealing process. In this case, the processing temperature of the annealing process for forming the second silicide layer 250 may differ according to Pt contents. For example, if the Pt contents are 5%, the processing temperature in the annealing process may be equal to or higher than 1100° C., and if the Pt contents are 10%, the processing temperature in the annealing process may be equal to or higher than 1150° C. Further, during performing of the annealing process, the temperature of the substrate 100 may be kept equal to or higher than 400° C.

Figure 25:
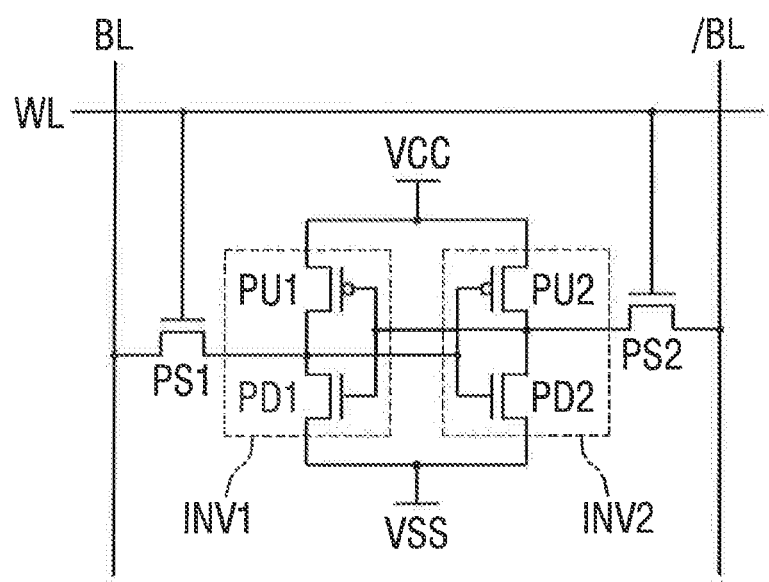
FIGS. 25 to 27 are a circuit diagram and layout diagrams of a semiconductor device according to an exemplary embodiment of the present inventive concept.
Figure 26:
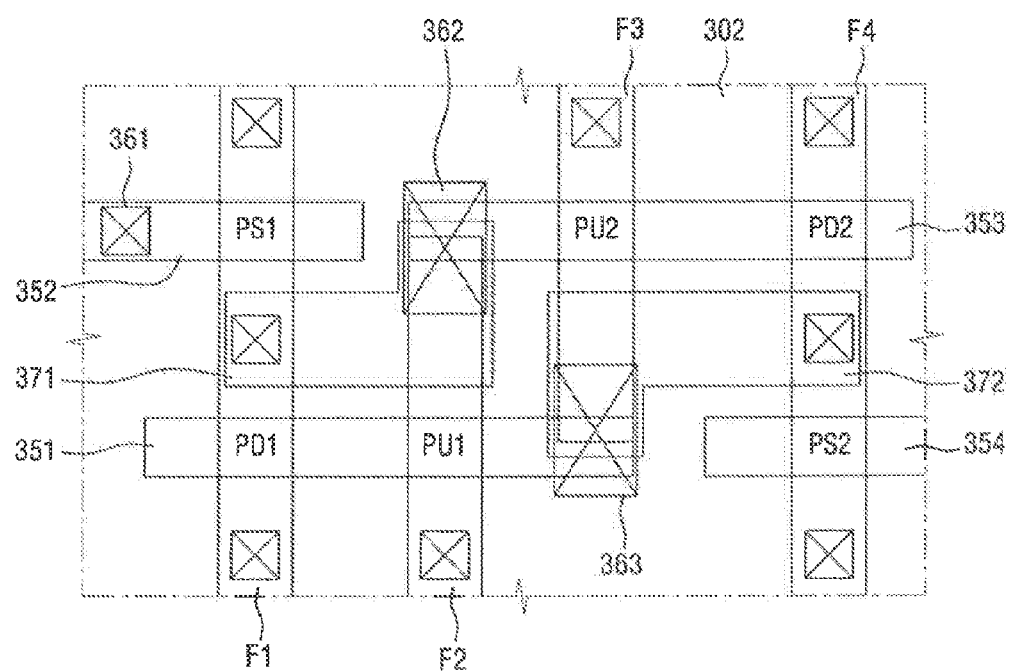
Figure 27:
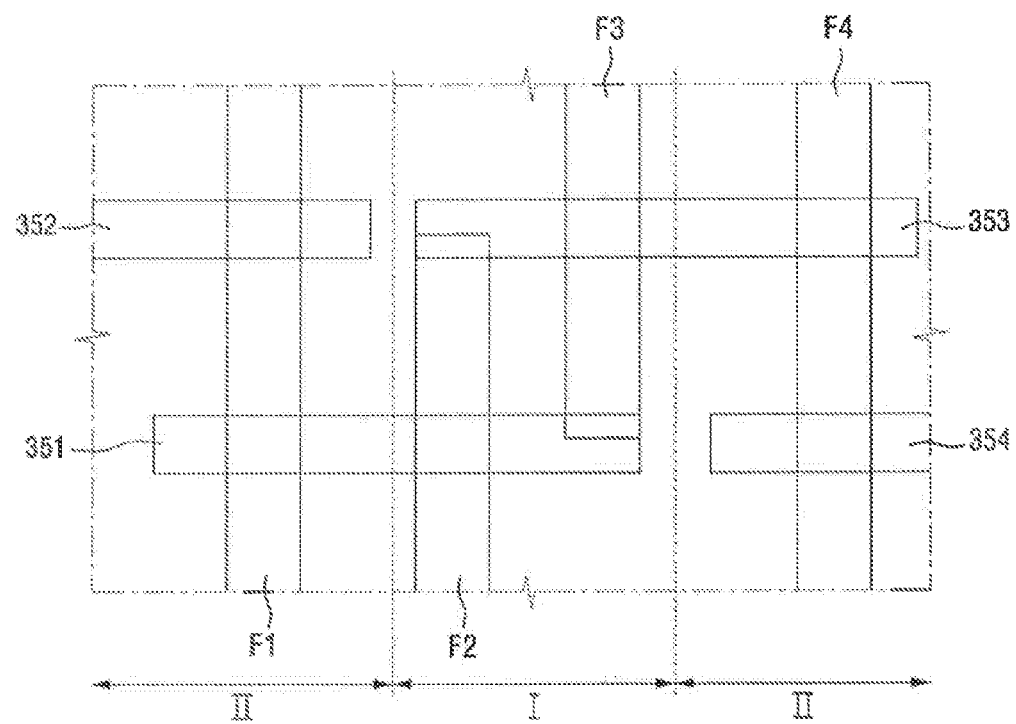

FIGS. 25 to 27 are a circuit diagram and layout diagrams of a semiconductor device according to an exemplary embodiment of the present inventive concept.

FIGS. 25 and 26 are a circuit diagram and a layout diagram of a semiconductor device according to an exemplary embodiment of the present inventive concept. FIG. 27 illustrates only a plurality of fins and a plurality of gate electrodes in the layout diagram of FIG. 26. The semiconductor device according to some embodiments of the present inventive concept can be applied to all devices composed of general logic elements that use fin transistors, but FIGS. 725 to 27 exemplarily illustrate an SRAM.

First, referring to FIG. 25, a semiconductor device according to an exemplary embodiment of the present inventive concept may include a pair of inverters INV1 and INV2 connected in parallel between a power supply node Vcc and a ground node Vss, and a first path transistor PS1 and a second pass transistor PS2 connected to output nodes of the respective inverters INV1 and INV2. The first pass transistor PS1 and the second pass transistor PS2 may be connected to a bit line BL and a complementary bit line /BL. Gates of the first pass transistor PS1 and the second pass transistor PS2 may be connected to a word line WL.

The first inverter INV1 includes a first pull-up transistor PU1 and a first pull-down transistor PD1 which are connected in series, and the second inverter INV2 includes a second pull-up transistor PU2 and a second pull-down transistor PD2. The first pull-up transistor PU1 and the second pull-up transistor PU2 may be PMOS transistors, and the first pull-down transistor PD1 and the second pull-down transistor PD2 may be NMOS transistors.

Further, the first inverter INV1 and the second inverter INV2 may constitute one latch circuit in a manner that an input node of the first inverter INV1 is connected to an output node of the second inverter INV2, and an input node of the second inverter INV2 is connected to an output node of the first inverter INV1.

Here, referring to FIGS. 25 to 27, a first fin F1, a second fin F2, a third fin F3, and a fourth fin F4, which are spaced apart from each other, are formed to extend long in one direction (for example, upper/lower direction in FIG. 26). The extending length of the second fin F2 and the third fin F3 may be shorter than the extending length of the first fin F1 and the fourth fin F4.

Further, a first gate electrode 351, a second gate electrode 352, a third gate electrode 353, and a fourth gate electrode 354 extend long in the other direction (for example, right/left direction in FIG. 26), and are formed in a direction crossing the first to fourth fins F1 to F4. Specifically, the first gate electrode 351 may be formed to completely cross the first fin F1 and the second fin F2 and to overlap a part of a vertical end of the third fin F3. The third gate electrode 353 may be formed to completely cross the fourth fin F4 and the third fin F3 and to overlap a part of a vertical end of the second fin F2. The second gate electrode 352 and the fourth gate electrode 354 may be formed to cross the first fin F1 and the fourth fin F4, respectively.

As illustrated in FIG. 26, the first pull-up transistor PU1 is defined around a region where the first gate electrode 351 and the second fin F2 cross each other, the first pull-down transistor PD1 is defined around a region where the first gate electrode 351 and the first fin F1 cross each other, and the first pass transistor PS1 is defined around a region where the second gate electrode 352 and the first fin F1 cross each other. The second pull-up transistor PU2 is defined around a region where the third gate electrode 353 and the third fin F3 cross each other, the second pull-down transistor PD2 is defined around a region where the third gate electrode 353 and the fourth fin F4 cross each other, and the second pass transistor PS2 is defined around a region where the fourth gate electrode 354 and the fourth fin F4 cross each other.

Although not clearly illustrated, recesses may be formed on both sides of areas where the first to fourth gate electrodes 351 to 354 and the first to fourth fins F1 to F4 cross each other, and the source/drain may be formed in the recess, and a plurality of contacts 361 may be formed.

In addition, a shared contact 362 simultaneously connects the second fin F2, the third gate electrode 353, and a wiring 371. A shared contact 363 simultaneously connects the third fin F3, the first gate electrode 351, and a wiring 372.

As the first pull-up transistor PU1, the first pull-down transistor PD1, the first pass transistor PS1, the second pull-up transistor PU2, the second pull-down transistor PD2, and the second pass transistor PS2, the semiconductor devices according to the above-described embodiments of the present inventive concept may be adopted.

Figure 28:
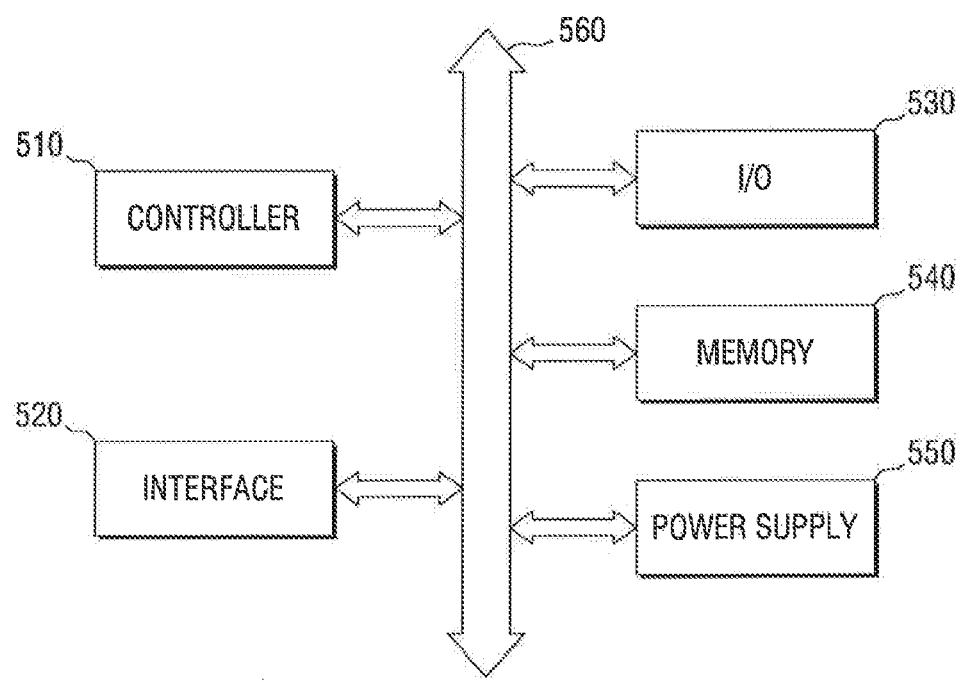
FIG. 28 is a schematic block diagram of an electronic system that includes a semiconductor device according to some embodiments of the present inventive concept.

Hereinafter, an electronic system including a semiconductor device according to some embodiments of the present inventive concept will be described. FIG. 28 is a schematic block diagram of an electronic system including a semiconductor device according to some embodiments of the present inventive concept.

Referring to FIG. 28, the electronic system may include a controller 510, an interface 520, an input/output (I/O) device 530, a memory 540, a power supply 550, and a bus 560.

The controller 510, the interface 520, the I/O device 530, the memory 540, and the power supply 550 may be connected to each other through the bus 560. The bus 560 corresponds to paths through which data is transferred.

The controller 510 may include at least one of a microprocessor, a microcontroller, and logic elements that can perform functions similar to the functions thereof to process data.

The interface 520 may function to transfer data to a communication network or to receive the data from the communication network. The interface 520 may be of a wired or wireless type. For example, the interface 520 may include an antenna or a wire/wireless transceiver.

The I/O device 530 may include a keypad and a display device to input/output data.

The memory 540 may store data and/or commands. In some embodiments of the present inventive concept, the semiconductor device may be provided as a partial constituent element of the memory 540.

The power supply 550 may convert a power input from an outside and provide the converted power to the respective constituent elements 510 to 540.

Figure 29:
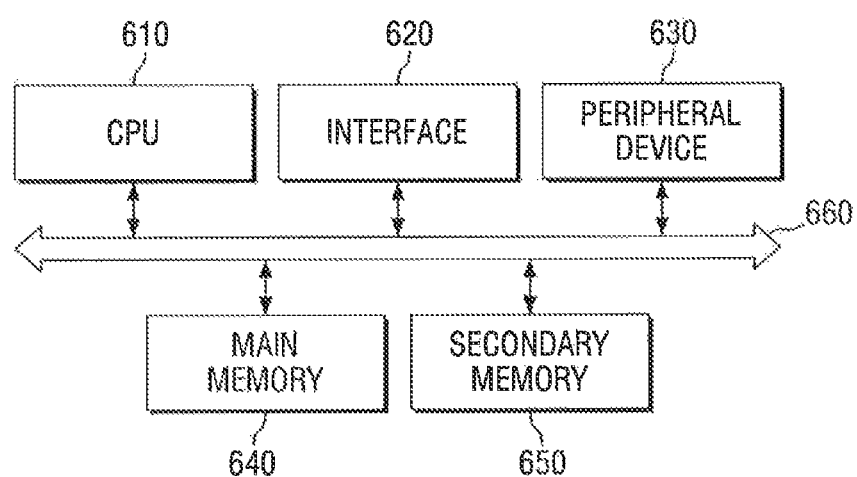
FIG. 29 is a schematic block diagram of an application example of an electronic system that includes a semiconductor device according to some embodiments of the present inventive concept.

FIG. 29 is a schematic block diagram of an application example of an electronic system including a semiconductor device according to some embodiments of the present inventive concept.

Referring to FIG. 29, an electronic system may include a CPU 610, an interface 620, a peripheral device 630, a main memory 640, a secondary memory 650, and a bus 660.

The CPU 610, the interface 620, the peripheral device 630, the main memory 640, and the secondary memory 650 may be connected to each other through the bus 660. The bus 660 corresponds to paths through which data is transferred.

The CPU 610 may include a controller, an arithmetic-logic unit, and the like, and may execute a program to process data.

The interface 620 may function to transfer data to a communication network or to receive the data from the communication network. The interface 620 may be of a wired or wireless type. For example, the interface 620 may include an antenna or a wire/wireless transceiver.

The peripheral device 630 may include a mouse, a keyboard, a display, and a printer, and may input/output data.

The main memory 640 may transmit/receive data with the CPU 610, and may store data and/or commands that execute the program. According to some embodiments of the present inventive concept, the semiconductor device may be provided as partial constituent elements of the main memory 640.

The secondary memory 650 may include a nonvolatile memory, such as a magnetic tape, a magnetic disc, a floppy disc, a hard disk, or an optical disk, and may store data and/or commands. The secondary memory 650 can store data even in the case where a power of the electronic system is intercepted.

In addition, the semiconductor device according to some embodiments of the present inventive concept may be provided as one of various constituent elements of electronic devices, such as a computer, a UMPC (Ultra Mobile PC), a work station, a net-book, a PDA (Personal Digital Assistants), a portable computer, a web tablet, a wireless phone, a mobile phone, a smart phone, an e-book, a PMP (Portable Multimedia Player), a portable game machine, a navigation device, a black box, a digital camera, a 3-dimensional television receiver, a digital audio recorder, a digital audio player, a digital picture recorder, a digital picture player, a digital video recorder, a digital video player, a device that can transmit and receive information in a wireless environment, one of various electronic devices constituting a home network, one of various electronic devices constituting a computer network, one of various electronic devices constituting a telematics network, an RFID device, or one of various constituent elements constituting a computing system.

Although exemplary embodiments of the present inventive concept have been described for illustrative purposes, those skilled in the art will appreciate that various modifications, additions and substitutions are possible, without departing from the scope and spirit of the present inventive concept as disclosed in the accompanying claims.

What is claimed is:

1. A method of manufacturing a semiconductor device, comprising:
preparing a substrate on which a first region and a second region are defined;
forming a first active fin and a second active fin in the first and second regions, respectively;
forming a first gate structure and a second gate structure on the substrate, the first and second gate structures crossing the first and second active fins, respectively;
forming a first recess in the first active fin, the first recess being adjacent to a sidewall of the first gate structure;
forming a first epitaxial layer in the first recess;

forming a first silicide layer on the first epitaxial layer;
forming a second recess in the second active fin, the second recess being adjacent to a sidewall of the second gate structure; and
forming a second silicide layer in the second recess,
wherein the second silicide layer includes nickel (Ni) and platinum (Pt).

2. The method claim 1, wherein the second silicide layer includes $(Ni(1-x)Pt(x))Si$ $(0<x<1)$.

3. The method of claim 1, wherein forming the first silicide layer includes performing an annealing process after forming a capping layer on the first epitaxial layer.

4. The method of claim 3, wherein the capping layer includes Si.

5. The method claim 3, wherein the first active fin comprises a plurality of fins, and the capping layer is formed to merge the adjacent first active fins.

6. The method of claim 1, wherein the first epitaxial layer includes SiGe.

7. The method of claim 1, wherein forming the second silicide layer includes forming a metal layer on a second epitaxial layer and performing an annealing process after forming the second epitaxial layer in the second recess.

8. The method of claim 7, wherein the second epitaxial layer includes SiP.

9. The method of claim 1, wherein the first region includes a PMOS region and the second region includes an NMOS region.

10. A method of manufacturing a semiconductor device, comprising:
preparing a substrate on which a first region and a second region are defined;
forming a first active fin and a second active fin in the first and second regions, respectively;
forming a first gate structure and a second gate structure on the substrate, the first and second gate structures crossing the first and second active fins, respectively;
forming a first recess in the first active fin, the first recess being adjacent to a sidewall of the first gate structure;
forming a first epitaxial layer in the first recess;
forming a first silicide layer on the first epitaxial layer; and
converting a part of the second active fin into a second silicide layer,
wherein the second silicide layer includes nickel (Ni) and platinum (Pt).

11. The method of claim 10, wherein the second silicide layer includes $(Ni(1-x)Pt(x))Si$ $(0<x<1)$.

12. The method of claim 10, wherein forming the first silicide layer includes performing an annealing process after forming a capping layer on the first epitaxial layer.

13. The method of claim 12, wherein the first active fin comprises a plurality of fins, and the capping layer is formed to merge the adjacent first active fins.

14. The method of claim 10, wherein converting the part of the second active fin into the second silicide layer includes forming a metal layer on the second active fin and performing an annealing process.

15. The method of claim 10, wherein the first region includes a PMOS region and the second region includes an NMOS region.

16. A method of manufacturing a semiconductor device, comprising:
preparing a substrate on which a first region and a second region are defined;
forming a first active fin and a second active fin in the first and second regions, respectively;
forming a first gate structure and a second gate structure on the substrate, the first and second gate structures crossing the first and second active fins, respectively;
forming a first recess in at least a part of the first active fin;
forming a first epitaxial layer in the first recess;
forming a first silicide layer on the first epitaxial layer;
forming a second epitaxial layer on at least a part of the second active fin; and
converting at least a part of the second active fin or the second epitaxial layer into a second silicide layer,
wherein the second silicide layer includes nickel (Ni) and platinum (Pt).

17. The method of claim 16, wherein the second silicide layer includes $(Ni(1-x)Pt(x))Si$ $(0<x<1)$.

18. The method of claim 16, wherein converting at least a part of the second active fin or the second epitaxial layer into the second silicide layer includes forming a metal layer on the second epitaxial layer and performing an annealing process.

19. The method of claim 18, wherein the second epitaxial layer includes SiP.

20. The method of claim 16, wherein the first region includes a PMOS region and the second region includes an NMOS region.

* * * * *